US006704818B1

United States Patent
Martin et al.

(10) Patent No.: US 6,704,818 B1
(45) Date of Patent: Mar. 9, 2004

(54) VOLTAGE-MODE DRIVER WITH PRE-EMPHASIS, SLEW-RATE CONTROL AND SOURCE TERMINATION

(75) Inventors: Aaron K. Martin, Hillsboro, OR (US);
Bryan K. Casper, Hillsboro, OR (US);
Joseph T. Kennedy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 424 days.

(21) Appl. No.: 09/752,645

(22) Filed: Dec. 29, 2000

(51) Int. Cl.[7] .............................................. G06F 13/00
(52) U.S. Cl. ...................................... 710/100; 713/401
(58) Field of Search ................................ 710/100, 300; 327/100, 112, 261, 263, 264, 276–278, 284, 285, 288; 713/401

(56) References Cited

U.S. PATENT DOCUMENTS

| 4,312,060 | A | * | 1/1982 | Grodinsky | ................... 369/134 |
| 4,479,250 | A | * | 10/1984 | Flood | .......................... 455/213 |
| 5,194,761 | A | * | 3/1993 | Smith | .......................... 327/306 |
| 5,739,707 | A | * | 4/1998 | Barraclough | ................ 327/112 |
| 6,256,235 | B1 | * | 7/2001 | Lee | ......................... 365/189.11 |
| 6,281,715 | B1 | * | 8/2001 | DeClue et al. | ................. 327/65 |
| 6,313,682 | B1 | * | 11/2001 | Muller et al. | ................ 327/291 |
| 6,466,626 | B1 | * | 10/2002 | Cecchi et al. | ................ 375/257 |

FOREIGN PATENT DOCUMENTS

| JP | 200236816600 A | * | 12/2002 | ............. H03F/3/50 |

* cited by examiner

*Primary Examiner*—Xuan M. Thai
(74) *Attorney, Agent, or Firm*—Blakely, Sokoloff, Taylor & Zafman LLP

(57) ABSTRACT

The invention provides an apparatus, method, and means for maintaining a constant slew rate while providing pre-emphasis, to adapt a push-pull voltage driver to the interconnect that it is driving. In an aspect, the invention modifies a driver output voltage amplitude, providing a small swing out for low frequency signals, and a large swing out for high frequency signals, such that low frequency signals and high frequency signals reach a receiver with equal amplitude. In an aspect, a slew rate control, having a delay mixer, selects and individually transmits to individual segments of a driver leg, at a desired time, one of output data and a signal for a pre-emphasis version of output data. In an aspect, the invention maintains a matched direct current termination impedance to the characteristic impedance of a transmission line being driven.

15 Claims, 5 Drawing Sheets

VOLTAGE-MODE DRIVER WITH PRE-EMPHASIS, SLEW-RATE CONTROL AND SOURCE TERMINATION

FIELD

This invention relates to a voltage-mode driver, more particularly, a push-pull voltage-mode driver which maintains a constant slew rate while providing pre-emphasis and source termination impedance.

BACKGROUND

In communicating data over a bus, integrated circuits are used. The integrated circuits include a data transmitter, or driver circuit, and a receiver circuit. Intersymbol interference is a function of the frequency content of data, and slew rate control is used to limit the frequency content. Pre-emphasis is also used to compensate for high frequency loss on a transmission line. Further, an impedance mismatch between the integrated circuit driver and a transmission line bus can decrease the signal-to-noise ratio. Techniques are also employed to reduce impedance mismatching.

One conventional slew rate control uses a delay chain to sequentially turn on and turn off the legs of a push-pull voltage driver. FIG. 1 shows a conventional voltage mode driver with slew rate control having four delay cells for sequentially switching four driver legs. The thevenin impedance of the driver from the input/output (I/O) pad is equal to the transmission line being driven, for the range between a bias voltage (Vcc) and a ground (Vss).

BRIEF DESCRIPTION OF THE DRAWINGS

Additional advantages of the invention will become apparent upon reading the following detailed description and upon reference to the drawings, in which.

DETAILED DESCRIPTION

Exemplary embodiments are described with reference to specific configurations. Those of ordinary skill in the art will appreciate that various changes and modifications can be made while remaining within the scope of the appended claims.

I/O circuits are continually increasing in speed but channels present non-ideal characteristics as speeds increase. A channel being a transmission line, interconnect, traces on a print circuit board, cable, etc. One non-ideal characteristic is frequency dependent loss across printed circuit board transmission lines and other lossy media. A transmission line is lossy such that when transmitting low frequencies, and switching from rail to rail, the received signal by the receiver will be rail to rail, not attenuated. However, when transmitting high frequencies through a transmission line, the signal amplitude is attenuated. Using driver pre-emphasis is one way to compensate for high-frequency loss that occurs when signaling at multi-gigabit rates. Pre-emphasis in a voltage mode driver is defined as modulating the voltage swing for various switching frequencies. Low frequency driver switching occurs with lower voltage swings, while higher frequency driver switching occurs with higher voltage swings.

In an embodiment, the invention provides an apparatus, method, and means for maintaining a constant slew rate while generating variable levels of pre-emphasis, to adapt a push-pull voltage driver to the interconnect that it is driving. The interconnect filters the signal sent from the driver to the receiver. For low frequency data, the interconnect causes a signal having a "sharp" edge to "roll off" between a driver and a receiver. For low frequencies, there is sufficient time for a signal to rise to its final value before a subsequent transition. However, for higher frequency data, the interconnect effectively "cuts off" the signal since it transitions before reaching its final peak value. Signals are increasingly attenuated as frequency is increased.

In an embodiment, the invention modifies the amplitude of low frequency signals such that high frequency signals and low frequency signals reach the receiver with equal amplitudes. That is, in an embodiment, the invention provides a small swing out for low frequencies, and a large swing out for high frequencies. Swing out being defined as modulating the driver output voltage amplitude.

Further, in an embodiment, the invention maintains a matched direct current termination impedance to the characteristic impedance of a transmission line being driven. The impedance is matched throughout the transition of a signal coupled to a transmission line. That is, the impedance matching to the transmission line is maintained while controlling the slew rate. The impedance is matched to terminate reflections returning to the driver and to terminate incoming signals for a bidirectional bus.

Figure 1:
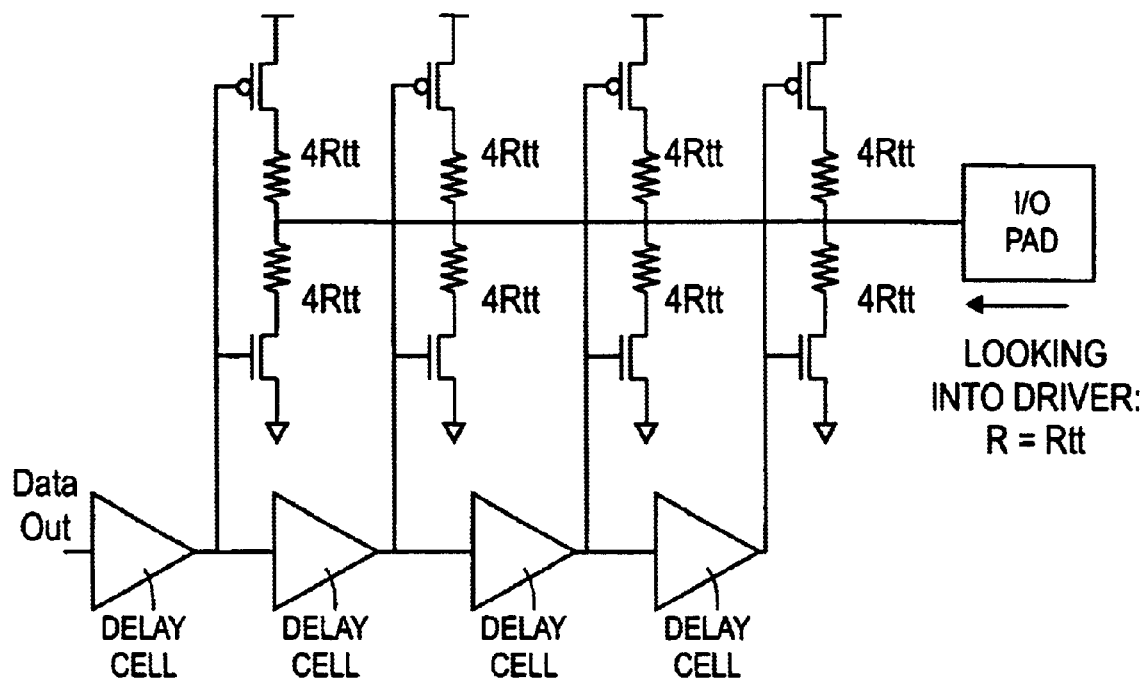
FIG. 1 depicts a schematic diagram of a conventional voltage-mode driver having slew-rate control and source termination.
Figure 2:
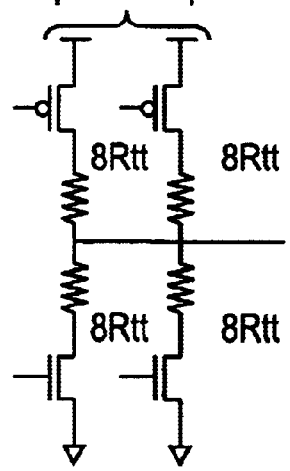
FIG. 2 depicts a schematic diagram of a driver leg split into two segments, in an embodiment of the invention.

In an embodiment, the invention provides slew rate control for desired pre-emphasis levels. As shown in FIG. 2, in an embodiment, leg 8 is divided into two segments, each segment having twice the impedance of the leg 8. By having two legs, three combinations are provided for pulling up and three combinations are provided for pulling down, providing a desired amount of pre-emphasis. When the driver is puling down, pre-emphasis is achieved by having a part, or all of the first leg, opposing the driver by pulling up. The outbound voltage is attenuated while the impedance is kept constant.

Figure 3:
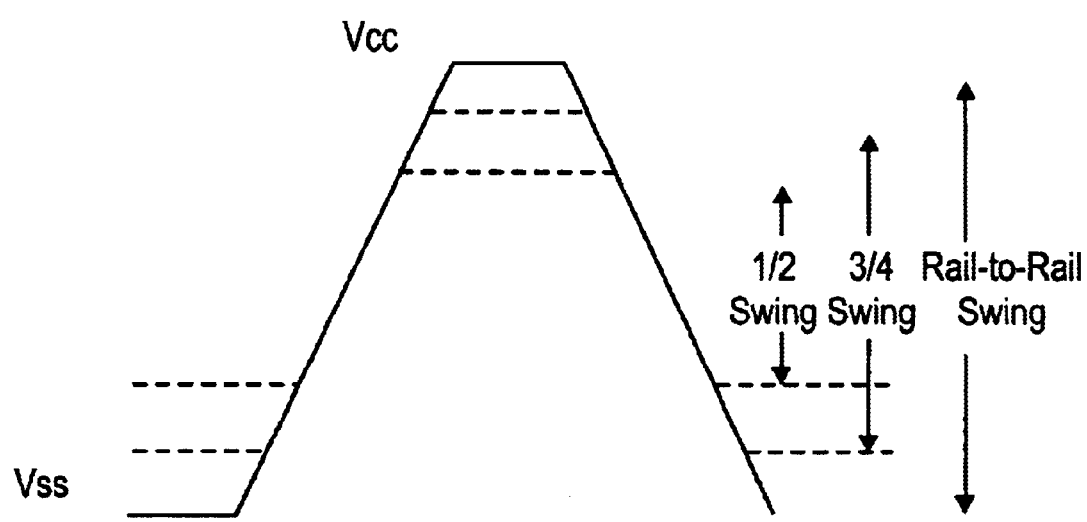
FIG. 3 depicts a simulation of time versus voltage of the driver of FIG. 2, showing variable voltage swings with pre-emphasis, in an embodiment of the invention.

In an embodiment, driver leg 8 is split into two legs, namely, driver leg 8a and driver leg 8b. FIG. 3 depicts the resulting voltage swings provided when driver leg 8 is split into two legs When driver legs 8a and 8b pull in the same direction as the driver, output 16 swings from rail to rail. When leg 8a pulls in the opposite direction of the driver, output 16 is attenuated by one-quarter. When both legs 8a and 8b switch in the opposite direction of the driver, output 16 is attenuated by one-half. In an embodiment, driver leg 8 is split into more than two segments, providing additional levels of pre-emphasis.

In an embodiment, a leg includes a positive-channel metal oxide semiconductor (PMOS) device, a negative-channel metal oxide semiconductor (NMOS) device, two resistors, a bias voltage input, and a ground input. Specifically, leg 8a includes PMOS device 24, NMOS device 26, resistor 48, resistor 50, bias voltage input 20, and ground input 22. Resistor 48 and resistor 50, being in series with, and having a large resistance in relation to the impedance of PMOS device 24 and NMOS device 26, add signal linearity from rail to rail.

In an embodiment, when the gate of PMOS 24 receives a low signal, leg 8 is pulled to Vcc and the output voltage swing rises from Vss toward Vcc. Next, following a delay, leg 10 is similarly pulled to Vcc and the output voltage swing rises closer to Vcc. Next, leg 12 and then leg 14 are similarly pulled to Vcc, each following a delay. After leg 14 is pulled to Vcc, the output voltage reaches Vcc. Alternatively, when the gate of PMOS 24 receives a high signal, and the gate of NMOS 26 receives a high signal, leg 8 is pulled from Vcc toward Vss. Next, following a delay, leg 10 is similarly pulled to Vss and the output voltage decreases closer to Vss. Next, leg 12 and then leg 14 are similarly pulled to Vss, each following a delay. After leg 14 is pulled to Vss, the output voltage drops to Vss.

Figure 4:
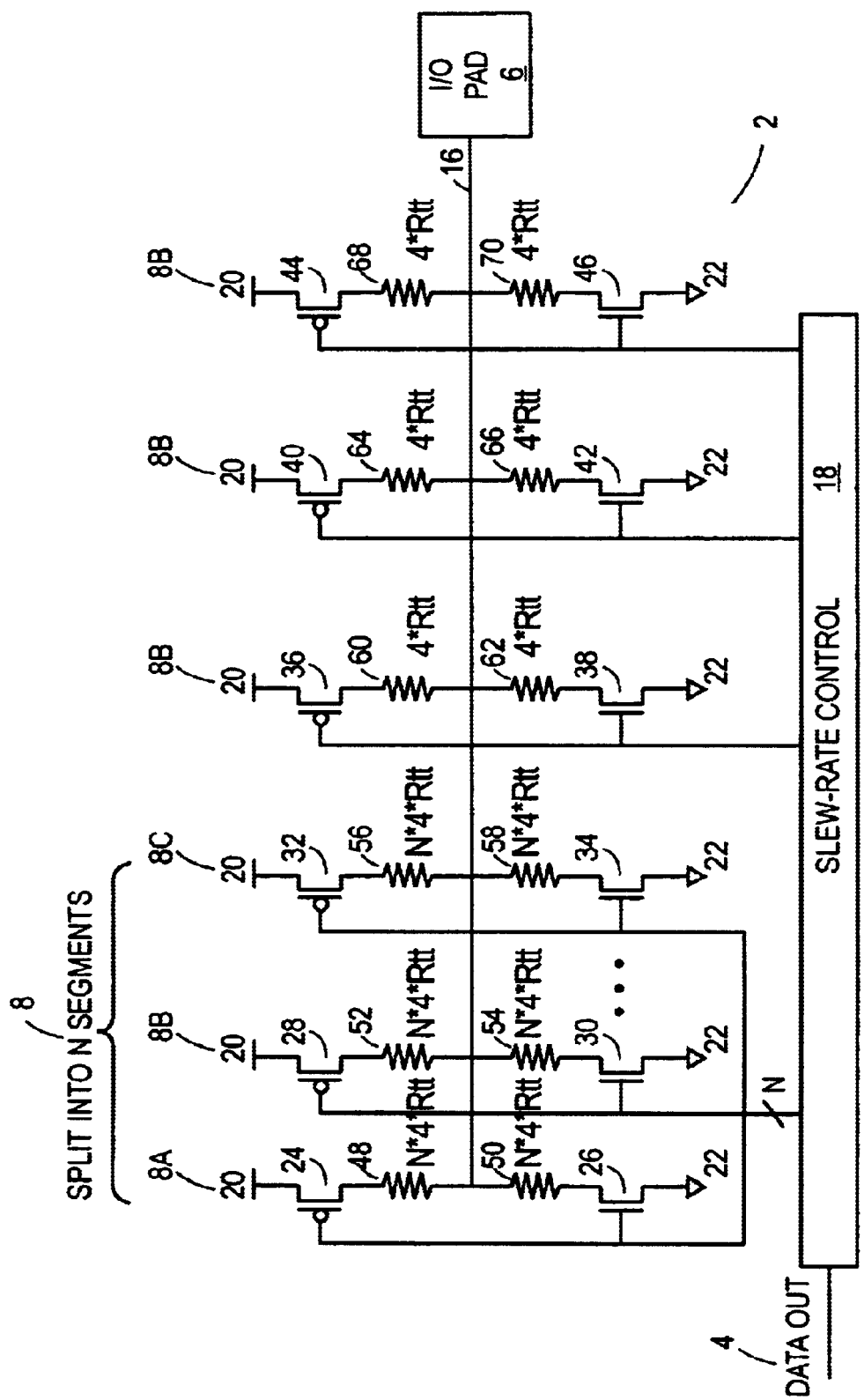
FIG. 4 depicts a schematic diagram of an embodiment of the invention having a driver leg split into multiple (N) segments and also showing a slew-rate control.

In an embodiment, as shown in FIG. 4, driver leg 8 is split into additional (N) segments. As shown, leg 8 is split into three segments, namely leg 8a, leg 8b and leg 8c, providing additional levels of pre-emphasis. If, for example, any one of leg 8a, leg 8b and leg 8c is pulling up, and the rest of the driver is pulling down, then the output voltage rises to 1/12 of Vcc. If any two of leg 8a, leg 8band leg 8c are pulling up, and the rest of the driver is pulling down, then the output voltage rises to 2/12 of Vcc. If leg 8a, leg 8b and leg 8c are all pulling up, and the rest of the driver is pulling down, then the output voltage rises to 3/12, also described as 1/4, of Vcc. While leg 8 is shown to be split into leg 8a, leg 8b and leg 8c, an embodiment of the invention is not limited to splitting leg 8 up into only three legs. That is, in an embodiment of the invention, leg 8 can be split up into as many legs as desired.

Figure 5:
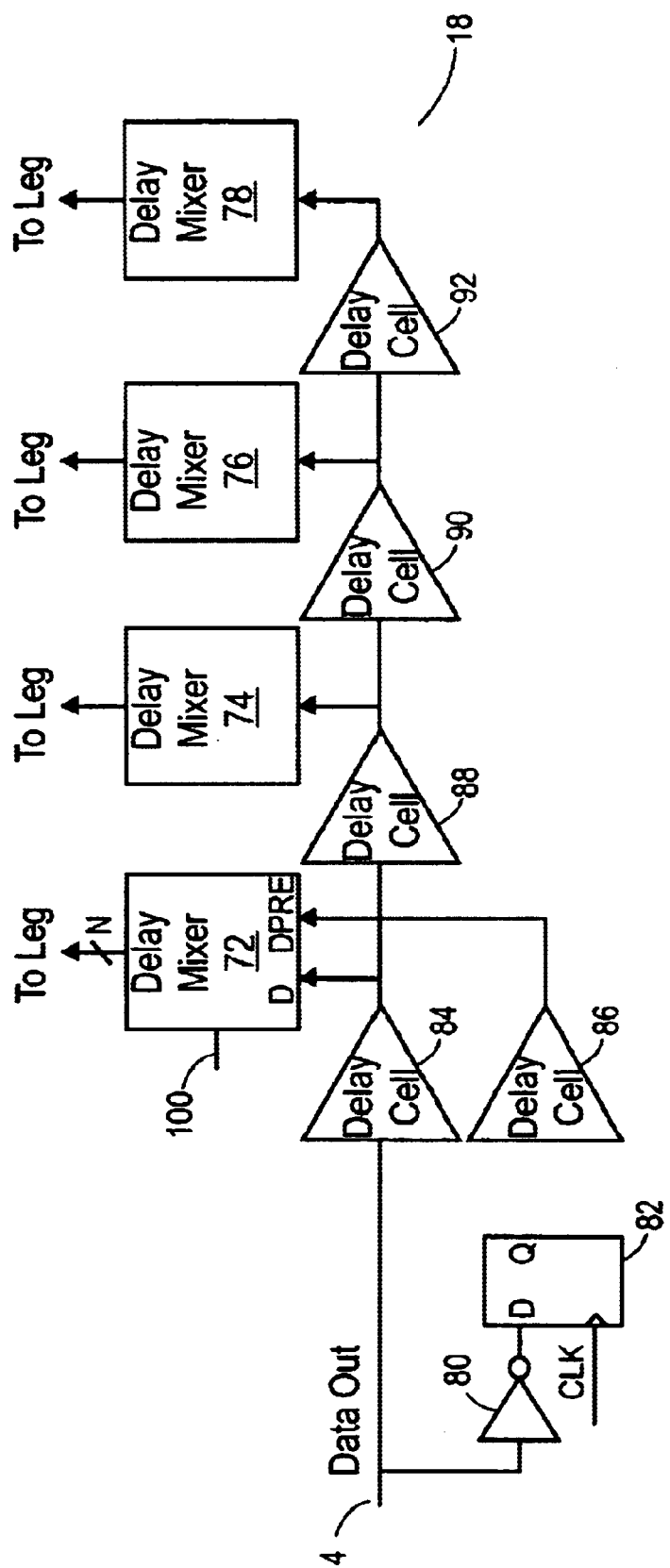
FIG. 5 is a more detailed illustration of the slew rate control of FIG. 4, in an embodiment of the invention.

In an embodiment, the structure shown in FIG. 5, slew rate control 18 holds data on the slew rate edge output, providing a constant slew rate for all levels of pre-emphasis. Delay cell 84, delay cell 88, delay cell 90 and delay cell 92 aid in the transmission of data to each driver leg sequentially.

In an embodiment, data out 4 includes two paths, a first path to delay cell 84 and a second path to inverter 80. The path to delay cell 84 provides data out (D). The path to inverter 80, then to flip-flop 82, for being delayed one cycle, and next to delay cell 86 for input to delay mixer 72 provides a signal for pre-emphasis version of data out (DPRE). In an embodiment, delay mixer 72 selects an input from one of data out 4 (D) and a signal for a pre-emphasis version of data out 4 (DPRE). Delay mixer 72 selects a delay for each segment of leg 8 depending on the desired voltage swing. In an embodiment, the control of delay mixer 72 selections is made using control 100. Delay mixer 72 selects a delay based on the number of segments of leg 8 to pull in the opposite direction as leg 10, leg 12 and leg 14. For example, if all segments of leg 8 are to pull in the opposite direction as leg 10, leg 12 and leg 14, giving the maximum amount of swing attenuation, then delay mixer 72 modulates leg 8 to provide a maximum amount of delay. In an embodiment, delay mixer 72 modulates leg 8a, leg 8b, and leg 8c independently. Delay mixer 72 modulates leg 8 to provide less delay if leg 8a and leg 8b, but not leg 8c, are to pull in the opposite direction of the remaining legs, than if all segments of leg 8 are to pull in the opposite direction of the remaining legs.

In an embodiment, for all segments of leg 8 to pull in the opposite direction as the remainder of driver 2, which is the maximum amount of pre-emphasis, then delay mixer 72 selects the pre-emphasis version of data out 4 (DPRE) for all segments of leg 8, with the minimum delay setting. For any segment of leg 8 that pulls in the same direction as the remainder of the driver 2, then delay mixer 72 selects an input from data out 4 (D) with the necessary setting to maintain a constant slew rate. In the case that pre-emphasis is not desired, delay mixer 72 selects an input from data out 4 (D) for all segments of leg 8, with minimum delay.

Figure 6:
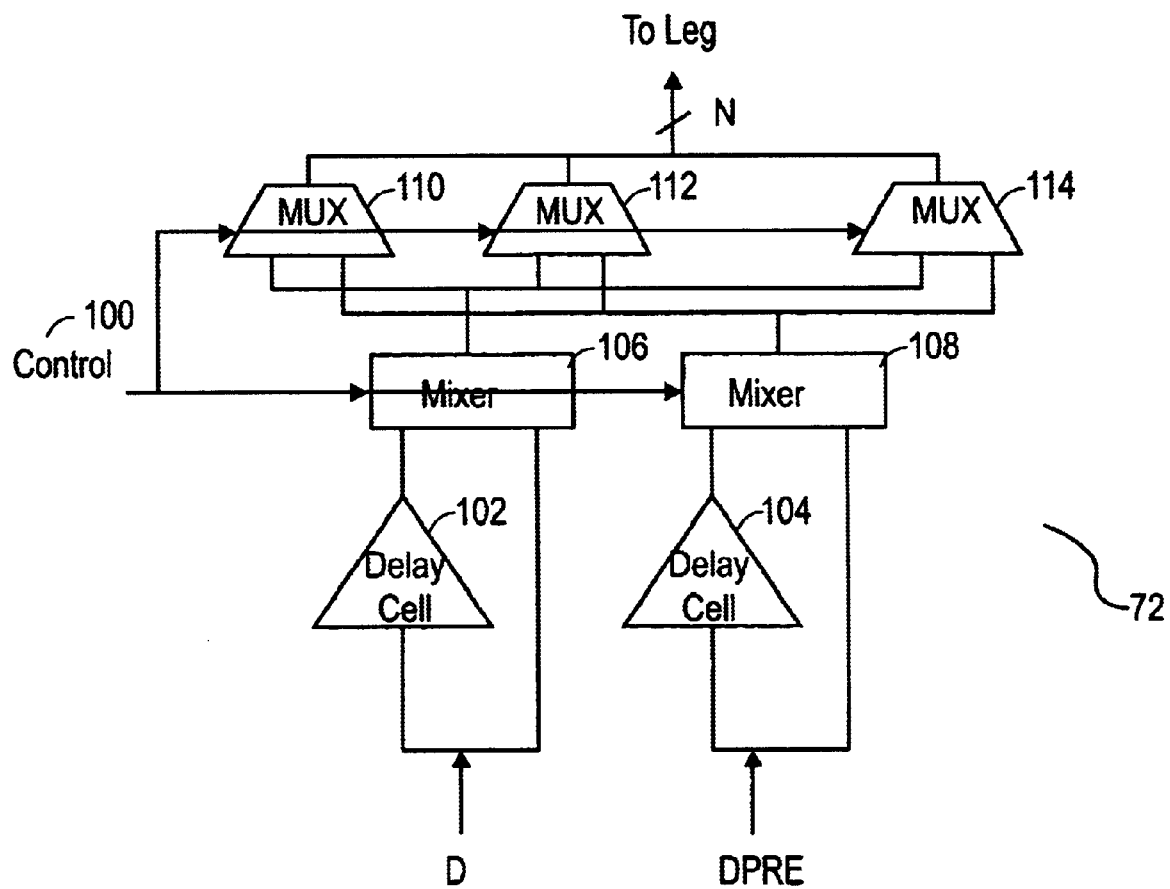
FIG. 6 depicts a more detailed illustration of a delay mixer of FIG. 5, in an embodiment of the invention.

As shown in FIG. 6, in an embodiment of the invention, delay mixer 72 further includes delay cell 102, delay cell 104, mixer 106, mixer 108, multiplexor 110, multiplexor 112, and multiplexor 114 to aid in transmitting, at the desired time, one of data out (D), pre-emphasis data out (DPRE), and a delayed version of data out (delayed D) to each individual segment of leg 8. As an example, in an embodiment in which leg 8 includes segments 8a and 8b, delay mixer 72 transmits signal DPRE to leg 8a, and transmits a delayed version of signal D (delayed D) to leg 8b. Delay cell 102 provides a delayed version of signal D (delayed D).

In an embodiment, since delay mixer 72 generates delay, delay mixer 74, delay mixer 76 and delay mixer 78 individually match the delay of delay mixer 72 to prevent, in specific circumstances, leg 10 from receiving data before leg 8 receives data.

In an embodiment, a system is provided. The system includes memory, an I/O port, and a microprocessor. The memory, I/O port, and microprocessor are connected by an address bus, a data bus and a control bus. The microprocessor includes an apparatus having a plurality of driver legs to drive a transmission line and provide pre-emphasis for data frequencies. The apparatus also includes a slew-rate control circuit having an input for receiving data frequencies, connected with the driver legs, configured to sequentially switch states of the driver legs and maintain a constant slew rate for the pre-emphasis. The driver legs maintain a matched direct current termination impedance to the characteristic impedance of the transmission line. In an embodiment, the driver legs include a PMOS device, an NMOS device, two resistors, a bias voltage, and a ground. In an embodiment, the slew-rate control circuit includes a plurality of delay mixers configured to select a delay for the driver legs, the slew-rate control circuit having an input control. In an embodiment, the invention is used in multi-gigabit serial and parallel interfaces on a microprocessor, chipset, dynamic random access memory (DRAM) interface, logic units, or other I/O circuits.

Having disclosed exemplary embodiments, modifications and variations may be made to the disclosed embodiments while remaining within the spirit and scope of the invention as defined by the appended claims.

What is claimed is:

1. An apparatus comprising:
   a plurality of driver legs to drive a transmission line and provide pre-emphasis for data frequencies; and
   a slew-rate control circuit having an input for receiving data frequencies, connected with said driver legs, to sequentially switch states of said driver legs and maintain a constant slew rate for said pre-emphasis, said slew-rate control circuit having a plurality of delay mixers to select a delay for said driver legs;
   wherein said driver legs are to maintain a matched direct current termination impedance to the characteristic impedance of said transmission line.

2. The apparatus as in claim 1, wherein said driver legs having a positive-channel metal oxide semiconductor (PMOS) device, a negative-channel metal oxide semiconductor (NMOS) device, two resistors, a bias voltage, and a ground.

3. The apparatus as in claim 1, wherein, said slew-rate control circuit having an input control.

4. A method comprising:
receiving data frequencies;
providing pre-emphasis for said data frequencies; and
maintaining a constant slew rate by selecting a delay while providing said pre-emphasis.

5. The method as in claim 4, further comprising driving a transmission line.

6. The method as in claim 5, further comprising maintaining a matched direct current termination impedance to the characteristic impedance of said transmission line.

7. A apparatus comprising:
means for receiving data frequencies;
means for providing pre-emphasis for said data frequencies; and
means for maintaining a constant slew rate by selecting a delay while providing said pre-emphasis.

8. The apparatus as in claim 7, further comprising means for driving a transmission line.

9. The apparatus as in claim 8, further comprising means for maintaining a matched direct current termination impedance to the characteristic impedance of said transmission line.

10. A system comprising:
a memory;
an input/output (I/O) port; and
a microprocessor;
wherein said memory, said I/O port, and said microprocessor are connected by an address bus, a data bus and a control bus; and
wherein said microprocessor includes a plurality of driver legs to drive a transmission line and provide pre-emphasis for data frequencies, and also includes a slew-rate control circuit having an input for receiving data frequencies, connected with said driver legs, to sequentially switch states of said driver legs and maintain a constant slew rate for said pre-emphasis, said slew-rate control circuit having a plurality of delay mixers to select a delay for said driver legs, wherein said driver legs maintain a matched direct current termination impedance to the characteristic impedance of said transmission line.

11. The system as in claim 10, wherein said driver legs having a positive-channel metal oxide semiconductor (PMOS) device, a negative-channel metal oxide semiconductor (NMOS) device, two resistors, a bias voltage, and a ground.

12. The system as in claim 10, wherein, said slew-rate control circuit having an input control.

13. A system comprising:
a memory;
an input/output (I/O) port; and
a microprocessor;
wherein said memory, said I/O port, and said microprocessor are connected by an address bus, a data bus and a control bus; and
wherein said microprocessor includes means for receiving data frequencies, means for providing pre-emphasis for said data frequencies, and means for maintaining a constant slew rate while providing said pre-emphasis by selecting a delay.

14. The system as in claim 13, further comprising means for driving a transmission line.

15. The system as in claim 14, further comprising means for maintaining a matched direct current termination impedance to the characteristic impedance of said transmission line.

* * * * *